TWO PASS ETCHING FOR FABRICATING PRINTED CIRCUITRY

Filed Sept. 18, 1961

Sidney K. Tally
George S. Price
George F. Gordon
INVENTORS
Robert O. Richardson
ATTORNEY United States Patent Office 3,177,103
Patented Apr. 6, 1965

3,177,103
TWO PASS ETCHING FOR FABRICATING PRINTED CIRCUITRY

Sidney K. Tally, George S. Price, and George F. Gordon, all of Nashua, N.H., assignors to Sanders Associates, Inc., Nashua, N.H., a corporation of Delaware
Filed Sept. 18, 1961, Ser. No. 138,909
4 Claims. (Cl. 156—3)

This invention relates to a method of making a unitary electrical conductor element for electrical apparatus having as a whole the form of a freely flexible sheet having a plurality of relatively isolated conducting paths embedded thereon.

More particularly this invention relates to a method of making flexible electrical conductors. The basic steps of the method required that a circuit configuration be etched on a sheet of foil.

The circuit configuration and integral foil sheet are then bonded to a sheet of thermoplastic insulating material. This thermoplastic material may be of the same types described in the patent to Dahlgren, Patent No. 2,997,521, which patent describes a typical prior art flexible printed circuit of a type similar to the flexible circuitry to be described hereafter. This step is followed by etching away the remaining foil until there only remains a discrete circuit configuration impressed in the sheet of thermoplastic.

In the production of printed fine line circuitry, there has existed a constant problem of maintaining precise dimensional stability between the circuit conductors due to the fact that subsequent applications of heat and pressure in conventional laminating techniques causes a thin film on the surface of the plastic base material to liquefy to some degree, coupled with a simultaneous drifting of the circuit configuration. In some instances the drifting causes the conductor elements to contact each other and short out upon application of current to the system.

The above noted problem is solved in the instant application by the impressing of a circuit configuration upon a plastic base, the circuitry maintaining its dimensional stability due to an integral circuit interconnector in the form of a foil sheet, which foil sheet is etched away to leave a discrete circuit arrangement embedded in the plastic base. The article thus produced may be utilized as is or where there are adverse atmospheric conditions, a cover coat of resinous plastic cover material may be applied with heat and pressure to thereby provide an encapsulated printed circuit in which the conductor paths maintain their dimensional stability due to the fact that the circuitry has been embedded in the plastic base as aforementioned. Another problem has arisen in the use of flexible printed circuitry in that whenever an electrical connection has to be made there was needed a manual removal of a portion of the plastic material to bare a portion of the circuitry. This problem has been solved by the provision of a prepunched plastic base to thereby eliminate the need for subsequent manual plastic removal.

It is, therefore, an object of this invention to provide a method of producing fine line flexible printed circuitry that has exceptional dimensional stability.

A further object of this invention is to produce a flexible printed circuit by the utilization of a two-pass etching process.

A still further object of this invention is to provide a process of multiple etching which will produce heavy current carrying circuitry, a portion of which is securely embedded in a plastic base.

Yet another object of this invention is to provide a flexible printed circuit apparatus which has prepositioned bared conductor portions which are accessible for electrical interconnection through openings in a plastic base.

Still another object of this invention is to provide a fine line circuitry which is recessed below the surface of a flexible plastic support base.

Other and further objects of the invention will be apparent from the following description of preferred methods and embodiments thereof, taken in connection with the accompanying drawings.

In the accompanying drawing.

Figures 1, 2, 3, 4, 5, 6, 7, 8, 9, 10, 11, 12, 13, 14:
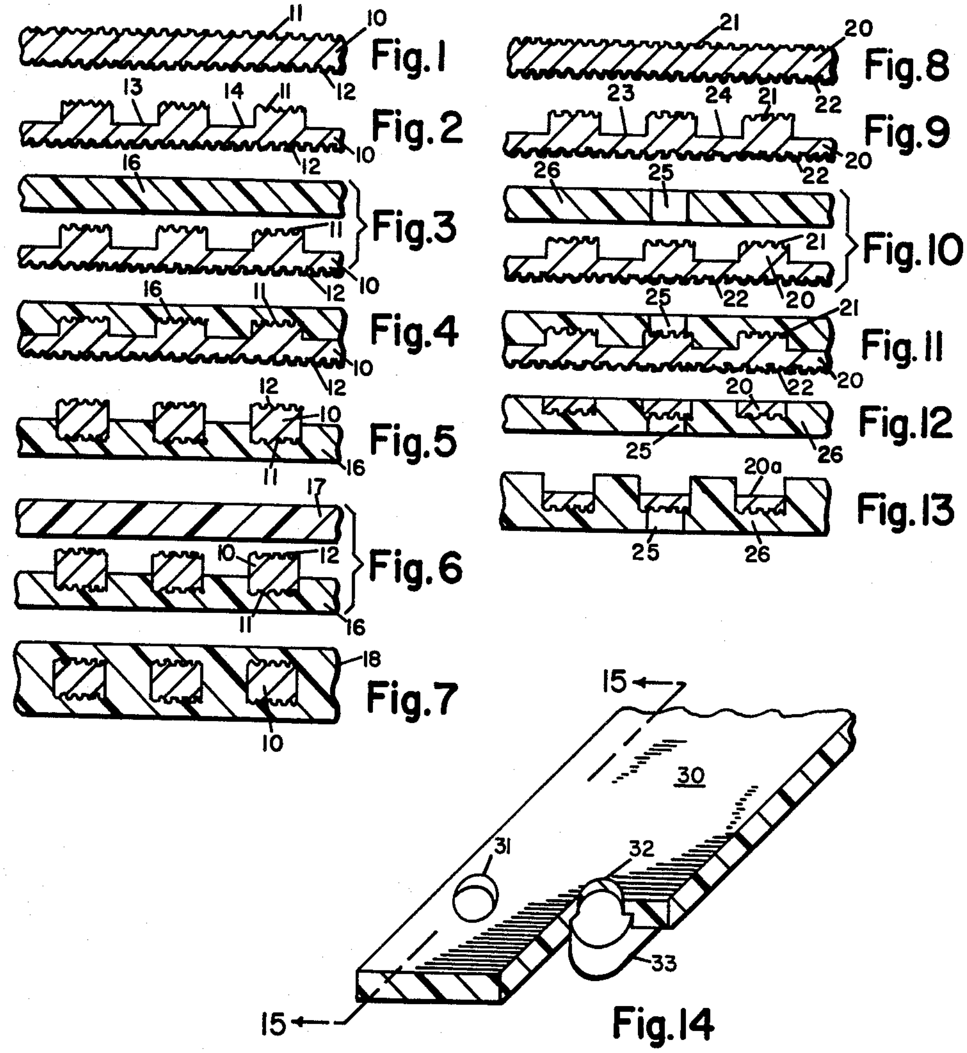
FIGURE 1 depicts a cross section of an oxide coated piece of metal foil.
FIGURE 2 illustrates a partially etched cross section of metal foil.
FIGURE 3 shows a partially etched cross section of metal foil with a layer of thermoplastic about to be affixed thereto.
FIGURE 4 depicts an assembly of etched metal foil with a thermoplastic material laminated thereto.
FIGURE 5 illustrates the assembly of FIGURE 4 in an inverted position with a portion of the copper foil removed.
FIGURE 6 shows an etched assembly of metal foil and integral plastic base with a cover layer of thermoplastic about to be affixed thereto.
FIGURE 7 is a cross section of a finished, fully encapsulated portion of a flexible printed circuit cable.
FIGURE 8 depicts a cross section of an oxide coated piece of metal foil.
FIGURE 9 illustrates a partially etched cross section of metal foil.
FIGURE 10 shows a partially etched cross section of metal foil with a prepunched layer of thermoplastic about to be affixed thereto.
FIGURE 11 depicts an assembly of etched metal foil with a prepunched thermoplastic material laminated thereto.
FIGURE 12 illustrates the assembly of FIGURE 11 in an inverted position with a portion of the copper foil removed.
FIGURE 13 illustrates the assembly of FIGURE 12 with the copper foil recessed in a plastic base.
FIGURE 14 is a perspective view of a partially cutaway portion of a flexible cable end section.

Referring now to the drawing and with particular reference to FIGURE 1, the thin sheet of copper 10 are prepared in the following manner:

(1) Immersing the sheet of copper 10 in a mild alkaline bath such as Dy-Clene EW Metal Cleaner, as manufactured by MacDermid, Inc., Waterbury, Connecticut, for five seconds, which cleaner consists of sodium metasilicate, tetrasodium pyrophosphate sodium hydroxide and a wetting agent such as alkyl aryl sulfonate plus water;

(2) Rinsing in cold, running water for five seconds;

(3) Dipping for 15 seconds in a 10 percent solution of hydrochloric acid which has dissolved in it 8 ounces per gallon of ferric chloride;

(4) Rinsing in cold, running water for 5 seconds;

(5) Immersing in a 10 percent solution of sodium cyanide for 15 seconds;

(6) Rinsing in cold, running water;

(7) Immersing in an oxidizing agent, such as a solution of 1½ pounds per gallon of water of Ebonol "C" Special as manufactured by Enthone Company, New Haven, Connecticut, for 10 minutes at 190–205° F., to provide a homogeneous coating of black cupric oxide 21, 22 on the copper surfaces.

The Ebonol "C" Special consists essentially of an alkali such as sodium hydroxide or potassium hydroxide and alkali metal chlorite such as sodium chlorite or potassium chlorite and is substantially described in U.S. Patent No.

2,364,993 issued to Walter R. Meyer; there remains three finishing steps which are;

(8) Immersing in cold, running water;

(9) Rinsing in hot, running water for 10 to 20 seconds;

(10) Baking in a preheated oven above 212° F. until all traces of moisture are removed.

Referring now to FIGURE 2, where there is shown a piece of copper foil 10 of the same type in FIGURE 1 wherein there has been provided on certain surfaces such as designated by 11 and 12 a photo-resist material and the portions 13 and 14 are etched away by conventional photo-etching techniques to a depth of approximately ½ to ⅔ of the way through the copper foil 10. The resist material may then be removed by immersion in an aqueous solution of trichloroethylene.

Referring now to FIGURE 3, there is seen a sheet of flexible thermoplastic 16 suspended or positioned above the sheet of etched copper foil 10 about to be laminated thereto.

Referring now to FIGURE 4, there is seen a finished laminate of plastic to copper foil where the plastic 16 has been forced down into and between the raised copper portions that are present due to the etching process noted in FIGURE 2.

Referring now to FIGURE 5, it will be noted that the plastic and copper foil have been inverted and one further step has occurred, that is, a resist material has been placed in register or matching relationship with the resist that was applied before the etching that produced FIGURE 2. This is produced by an etching process which removed the intermediate portions between the raised copper portions of FIGURE 2 and we now have discrete circuit paths present embedded respectively ½ or ⅔ of their thickness in a base plastic 16. If it is desired, there may be added as shown in FIGURE 6 and in FIGURE 7, a plastic cover coat, for example 17, which is placed upon the conductor elements after removal of resist and through suitable heat and pressure caused to bond with the base plastic 16 and the roughened oxide surfaces 11, 12 of the conductor elements as shown in FIGURE 6 and FIGURE 7.

Referring now to FIGURE 8, there is seen a sectioned copper foil sheet 20 with oxide surfaces 21 and 22 prepared in the same manner described in the preparation of the copper foil of FIGURE 1. Accordingly, FIGURE 9 has been etched away at points 23 and 24, for example, in the same manner described with regard to FIGURE 2.

Referring now to FIGURE 10, there is seen superimposed above the copper foil 20 a thermoplastic sheet 26 in which there appears an opening 25, this opening 25 is prepunched and positioned so that it is directly over a point on the surface of the raised circuit configurations. It will be noted at this time that the opening 25 is in direct register with a surface of the central circuit portion, as shown in FIGURE 11.

Referring now to FIGURE 12, it will be noted that the plastic base 26 and the copper foil 20 have undergone a further etching process which has removed almost all of the foil backing starting at the surface 22 as shown in FIGURE 11 and down to the point where only discrete conductor paths exist embedded in the surface of the plastic 26. It should also be noted at this time that the opening 25 directly exposes one of the conductor elements. As noted in the objects, the location of this opening permits the electrical connections with outside energy sources to the circuitry through the opening 25 without the manual removal problems of scraping away a portion of the plastic in order to get to the circuitry.

Referring now to FIGURE 13, there is noted that the etching process has been carried one step further in that the copper foil 20, as shown in FIGURE 11, has been etched down past the upper surface of the plastic base 26 and now has been reduced to a thickness which is less than the impressed depth of the circuit configuration brought about by the lamination shown in FIGURES 10 and 11. This step has produced a fine line circuitry 20*a*, whose electrical characteristics depend solely on the thickness of the circuitry configuration desired and the current loads to be carried by the circuitry.

Referring now to FIGURE 14, where there is shown a perspective view of an end portion of a typical piece of flexible printed circuitry produced by the above noted etching techniques. FIGURE 14 discloses a plastic base laminate 30 which has located on the surface thereof openings 31 and 32 which communicate respectively with specific embedded conductor portions, for example 33.

Figure 15:
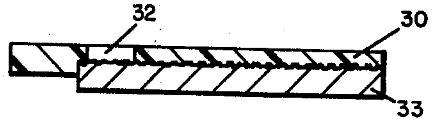
FIGURE 15 is a cross section taken along the line 15—15 in FIGURE 14.

Referring now to FIGURE 15, which shows a cross section of a portion of flexible printed circuitry depicted in FIGURE 14, it will be noted that the conductor path 33 is partially embedded in the plastic base 30 and is accessible from the plastic side of the flexible printed circuitry through opening 32.

While there has been hereinbefore described what are at present considered preferred embodiments of the invention, it will be apparent that many and various changes and modifications may be made with respect to the embodiments illustrated, without departing from the spirit of the invention. It will be understood, therefore, that all changes and modifications as fall fairly within the scope of the present invention, as defined in the appended claims, are to be considered as part of the present invention.

What is claimed is:

1. The method of making a unitary electrical conductor element for electrical apparatus having the form of a freely flexible sheet and providing a plurality of discrete conducting paths comprising the following steps:

(*a*) etching partially through a sheet of foil to leave an embossed circuit pattern on said foil, (*b*) positioning said foil with its embossed face in contact with a flexible base sheet of thermoplastic resinous insulating material and by heat and pressure causing said sheet of foil to bond to said sheet of thermoplastic to thereby lock said circuit pattern in position to maintain said circuit pattern's dimensional stability during subsequent processing, (*c*) etching through said foil from the side which has not yet been etched until the circuit pattern becomes discrete, (*d*) placing a covering of substantially similar flexible thermoplastic as said base over said base and discrete circuit pattern, and (*e*) applying heat and pressure to cause said covering to flow into exposed areas of said base to effect a bond of the surface of said covering to the surface of the exposed areas and said circuit pattern, said circuit pattern maintaining its dimensional stability during the application of heat and pressure.

2. The method of making a unitary electrical conductor element for electrical apparatus having the form of a freely flexible sheet and providing a plurality of discrete conducting paths comprising the following steps:

(*a*) screening on a sheet of foil a pattern of resist material, (*b*) etching one-half to two-thirds of the way through said foil thereby leaving an embossed circuit pattern on said foil, (*c*) removing said resist, (*d*) positioning the foil with its embossed face in contact with a flexible base sheet of thermoplastic resinous insulating material and by heat and pressure causing the sheet of foil to bond to said sheet of thermoplastic to thereby lock said circuit pattern in position to maintain said circuit pattern's dimensional stability during subsequent processing, (*e*) etching through said foil from the side which has not yet been etched until the circuit pattern becomes discrete, (*f*) placing a covering of substantially similar flexible thermoplastic as said base over said base and discrete circuit pattern, and (g) applying heat and pressure to cause said covering to flow into exposed areas of said base to effect a bond of the surface of said covering to the surface of the exposed areas and said circuit pattern.

3. The method of making a unitary electrical conductor element for electrical apparatus having the form of a freely flexible sheet and providing a plurality of relatively isolated conducting paths comprising the following steps:

screening on a sheet of foil a pattern of resist material, etching one-half to two-thirds of the way through said foil thereby leaving an embossed circuit pattern on said foil, punching openings in a base sheet of flexible thermoplastic resinous insulating material in a predetermined pattern, positioning said foil with its embossed face in contact with said flexible base sheet of thermoplastic resinous insulating material so that specific portions of the pattern are aligned with the punched openings of said flexible thermoplastic material, applying heat and pressure to cause said sheet of foil to bond to said sheet of thermoplastic, screening a second pattern on the unetched side of said foil in register with said first pattern, etching through said foil from the side which has not yet been etched until the circuitry pattern becomes discrete, placing a covering of substantially similar flexible thermoplastic as said base over said base and discrete circuitry pattern, applying heat and pressure to cause said covering to flow into exposed areas of said base to effect a bond of the surface of said covering to the surface of the exposed areas and said circuitry pattern.

4. The method of making a unitary electrical conductor element for electrical apparatus having the form of a freely flexible sheet and providing a plurality of discrete conducting paths comprising the following steps:

(a) oxidizing the surfaces of a sheet of copper foil to provide adherent, effectively integral coatings of black cupric oxide, (b) screening on said sheet of copper foil a pattern of resist material, (c) etching one-half to two-thirds of the way through said copper thereby leaving an embossed circuit pattern on said copper foil, (d) removing said resist, (e) positioning the foil with its embossed face in contact with a flexible base sheet of thermoplastic resinous insulating material and by heat and pressure causing the sheet of foil with its embossed circuit pattern to be embedded in said thermoplastic to thereby lock said circuit pattern in position to maintain said circuit pattern's dimensional stability during subsequent processing and to bond to the adjacent oxide coating, (f) screening a second pattern of resist on the unetched side of said copper foil in register with said first pattern, (g) etching through the copper from the side which has not yet been etched until the circuit pattern becomes discrete, (h) removing the resist, (i) placing a covering of substantially similar flexible thermoplastic as said base over said base and discrete circuit pattern, and (j) applying heat and pressure to cause said covering to flow into exposed areas of said base to effect a bond of the surface of said covering to the surface of the exposed areas and said circuit pattern, said circuit pattern maintaining its dimensional stability during the application of heat and pressure.

References Cited by the Examiner

UNITED STATES PATENTS

| | | | |
|---|---|---|---|
| 378,423 | 2/88 | Baynes | 156—11 |
| 2,997,521 | 8/61 | Dahlgren | 156—8 |

OTHER REFERENCES

IBM Technical Disclosure Bulletin, vol. 1, No. 2, August 1958, page 25.

EARL M. BERGERT, *Primary Examiner.*